(12) United States Patent
Doan et al.

(10) Patent No.: US 7,012,010 B2
(45) Date of Patent: Mar. 14, 2006

(54) METHODS OF FORMING TRENCH ISOLATION REGIONS

(75) Inventors: Trung Tri Doan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 10/688,439

(22) Filed: Oct. 16, 2003

(65) Prior Publication Data

US 2004/0082181 A1 Apr. 29, 2004

Related U.S. Application Data

(62) Division of application No. 10/330,881, filed on Dec. 23, 2002, now Pat. No. 6,719,012, which is a continuation of application No. 10/209,865, filed on Aug. 2, 2002, now Pat. No. 6,583,028, which is a continuation of application No. 09/900,117, filed on Jul. 6, 2001, now abandoned, which is a continuation of application No. 09/385,915, filed on Aug. 30, 1999, now Pat. No. 6,300,219.

(51) Int. Cl.
*H01L 21/76* (2006.01)

(52) U.S. Cl. ....................... 438/427; 438/431
(58) Field of Classification Search ............... 438/424, 438/427, 431
See application file for complete search history.

(56) References Cited

U.S. PATENT DOCUMENTS

| | | | |
|---|---|---|---|
| 3,990,927 A | 11/1976 | Montier | |
| 4,474,975 A | 10/1984 | Clemons et al. | |
| 5,105,253 A | 4/1992 | Pollock | 357/49 |
| 5,156,881 A | 10/1992 | Okano et al. | |
| 5,182,221 A | 1/1993 | Sato | |

(Continued)

FOREIGN PATENT DOCUMENTS

| | | |
|---|---|---|
| EP | 0817251 A1 | 11/1997 |
| JP | 02277253 A | 11/1990 |
| JP | 05-315441 | 11/1993 |
| JP | 06-334031 | 12/1994 |
| JP | 146224 | 1/1996 |
| WO | 02/27063 A2 | 4/2002 |
| WO | 2004/021156 | 7/2003 |

OTHER PUBLICATIONS

Beekman et al., *Sub–micron Gap Fill and In–Situ Planarisation using Flowfill™ Technology*, Electrotech 1–7 ULSI Conference, Portland, OR (Oct. 1995).

Horie et al., *Kinetics and Mechanism of the Reactions of $O(^3P)$ with $SiH_4, CH_3SiH_3, (CH_3)_2SiH_2,$ and $(CH_3)_3SiH$*, 95 J. Phys. Chem 4393–4400 (1991).

(Continued)

*Primary Examiner*—David S. Blum
(74) *Attorney, Agent, or Firm*—Wells St. John P.S.

(57) ABSTRACT

In accordance with an aspect of the invention, a method of forming a trench isolation region includes forming a trench within a substrate. A silanol layer is formed to partially fill the trench and then converted, at least some of the silanol, to a compound including at least one of $SiO_n$ and $RSiO_n$, where R includes an organic group. An electrically insulative material is formed over the converted silanol to fill the trench. In another aspect of the invention, a method of forming a trench isolation region includes forming a trench within a substrate. A first layer of at least one of $Si(OH)_x$ and $(CH_3)_ySi(OH)_{4-y}$ is formed to partially fill the trench. At least some of the $Si(OH)_x$ if present is converted to $SiO_2$ and at least some of $(CH_3)_ySi(OH)_{4-y}$ if present is converted to $(CH_3)_xSiO_{2-x}$. Next, a layer of an electrically insulative material is formed to fill the trench.

5 Claims, 6 Drawing Sheets

U.S. PATENT DOCUMENTS

| | | | |
|---|---|---|---|
| 5,410,176 A | 4/1995 | Liou et al. | |
| 5,470,798 A | 11/1995 | Ouellet | |
| 5,604,149 A | 2/1997 | Paoli et al. | 437/67 |
| 5,616,513 A | 4/1997 | Shepard | 438/402 |
| 5,719,085 A | 2/1998 | Moon et al. | |
| 5,741,740 A | 4/1998 | Jang et al. | |
| 5,770,469 A | 6/1998 | Uram et al. | 437/240 |
| 5,776,557 A | 7/1998 | Okano et al. | |
| 5,786,039 A | 7/1998 | Brouquet | |
| 5,786,263 A | 7/1998 | Perera | 438/431 |
| 5,801,083 A | 9/1998 | Yu et al. | |
| 5,863,827 A | 1/1999 | Joyner | |
| 5,883,006 A | 3/1999 | Iba | |
| 5,888,880 A | 3/1999 | Gardner et al. | |
| 5,895,253 A | 4/1999 | Akram | |
| 5,895,255 A | 4/1999 | Tsuchiaki | 438/427 |
| 5,904,540 A | 5/1999 | Sheng et al. | |
| 5,923,073 A | 7/1999 | Aoki et al. | 257/501 |
| 5,930,645 A | 7/1999 | Lyons et al. | |
| 5,943,585 A | 8/1999 | May et al. | |
| 5,950,094 A | 9/1999 | Lin et al. | |
| 5,960,299 A | 9/1999 | Yew et al. | |
| 5,972,773 A | 10/1999 | Liu et al. | |
| 5,981,354 A | 11/1999 | Spikes et al. | 438/424 |
| 5,989,978 A | 11/1999 | Peidous | 438/436 |
| 5,998,280 A | 12/1999 | Bergemont et al. | |
| 6,013,583 A | 1/2000 | Ajmera et al. | |
| 6,030,881 A | 2/2000 | Papasouliotis et al. | |
| 6,033,961 A | 3/2000 | Xu et al. | 438/295 |
| 6,051,477 A | 4/2000 | Nam | |
| 6,090,675 A | 7/2000 | Lee et al. | 438/301 |
| 6,156,674 A | 12/2000 | Li et al. | |
| 6,171,962 B1 | 1/2001 | Karlsson et al. | 438/692 |
| 6,187,651 B1 | 2/2001 | Oh | 438/435 |
| 6,191,002 B1 | 2/2001 | Koyanagi | 438/431 |
| 6,300,219 B1 | 10/2001 | Doan et al. | |
| 6,326,282 B1 | 12/2001 | Park et al. | 438/424 |
| 6,329,266 B1 | 12/2001 | Hwang et al. | 438/424 |
| 6,355,966 B1 | 3/2002 | Trivedi | 257/499 |
| 6,448,150 B1 | 9/2002 | Tsai et al. | 438/427 |
| 6,455,394 B1 * | 9/2002 | Iyer et al. | 438/428 |
| 6,534,395 B1 | 3/2003 | Werkhoven et al. | |
| 6,583,028 B1 | 6/2003 | Doan et al. | |
| 6,583,060 B1 | 6/2003 | Trivedi | 438/700 |
| 6,617,251 B1 | 9/2003 | Kamath et al. | 438/691 |
| 6,719,012 B1 | 4/2004 | Doan et al. | |
| 2001/0006255 A1 | 7/2001 | Kwon et al. | 257/751 |
| 2001/0006839 A1 | 7/2001 | Yeo | 438/435 |
| 2001/0041250 A1 | 11/2001 | Werkhoven et al. | |
| 2001/0046753 A1 | 11/2001 | Gonzalez et al. | 438/424 |
| 2002/0000195 A1 | 1/2002 | Bang et al. | |
| 2002/0004284 A1 | 1/2002 | Chen | 438/427 |
| 2002/0018849 A1 | 2/2002 | George et al. | |
| 2003/0032281 A1 | 2/2003 | Werkhoven et al. | |
| 2003/0129826 A1 | 7/2003 | Werkhoven et al. | |
| 2004/0209484 A1 | 10/2004 | Hill et al. | |
| 2004/0266153 A1 | 12/2004 | Hu | |

OTHER PUBLICATIONS

Joshi et al., *Plasma Deposited Organosilicon Hydride Network Polymers as Versatile Resists for Entirely Dry Mid–Deep UV Photolithography*, 1925 SPIE 709–720 (Jan. 1993).

Kiermasz et al., *Planarisation for Sub–Micron Devices Utilising a New Chemistry*, Electrotech 1–2, DUMIC Conference, California (Feb. 1995).

Kojima et al., *Planarization Process Using a Multi–Coating of Spin–on–Glass*, V–MIC Conference, pp. 390–396 (Jun. 13–14, 1988).

Matsuura et al., *A Highly Reliable Self–planarizing Low–k Intermetal Dielectric for Sub–quarter Micron Interconnects*, 97 IEEE 785–788 (Jul. 1997).

Matsuura et al., *Novel Self–planarizing CVD Oxide for Interlayer Dielectric Applications*, 94 IEEE 117–120 (1994).

McClatchie et al. *Low Dielectric Constant Flowfill™ Technology for IMD Applications*, 7 pages (pre–Aug. 1999).

Withnall et al., *Matrix Reactions of Methylsilanes and Oxygen Atoms*, 92 J. Phys. Chem. 594–602 (1998).

Curtis et al, "APCVD TEOS: O3 Advanced Trench Isolation Applications", Semiconductor Fabtech, $9^{th}$ Ed., p. 241–247.

George, S.M. et al., "Atomic layer controlled deposition of $SiO_2$ and $Al_2O_3$ using ABAB . . . binary reaction sequence chemistry", Applied Surface Science 82/83, Elsevier Science B.V., Jul. 10, 1994, p. 460–467.

Morishita et al. "Atomic–layer chemical–vapor–deposition of silicon–nitride", Applied Surface Science 112, Elsevier Science B.V., 1997, p. 198–204.

Yokoyama et al. "Atomic layer controlled deposition of silicon nitride and in situ growth observation by infrared reflection absorption spectroscopy", Applied Surface Science 112, Elsevier Science B.V., 1997, p. 75–81.

Gasser et al., "Quasi–monolayer deposition of silicon dioxide", Elsevier Science S.A., 1994, p. 213–218.

Shareef et al., "Subatmospheric chemical vapor deposition ozone/TEOS process for $SiO_2$ trench filling", J. Vac. Sci. Technol. B 13(4), Jul/Aug 1995, p. 1888–1892.

Disclosed Anonymous 32246, "Substrate Contact with Closed Bottom Trenches", Research Disclosure, Feb. 1991, 1 page.

Hausmann et al., *Rapid Vapor Deposition of Highly Conformal Silica Nanolaminates*, 298 SCIENCE 402–406 (Oct. 11, 2002).

Miller et al., *Self–limiting chemical vapor deposition of an ultra–thin silicon oxide film using tri–(tert–butoxy) Silanol*, 397 Thin Solid Films 78–82 (2001).

U.S. Appl. No. 10/931,524, filed Aug. 31, 2004, Sandhu.

U.S. Appl. No. 10/615,051, filed Jul. 7, 2003, Vaartstra.

U.S. Appl. No. 10/655,699, filed Sep. 5, 2003, Derderian et al.

U.S. Appl. No. 10/806,923, filed Mar. 22, 2004, Li et al.

Hausmann et al., "Catalytic vapor deposition of highly conformal silica nanolaminates", Department of Chemistry and Chemical Biology, Harvard University, May 14, 2002, pp. 1–13.

Klaus et al., *Atomic Layer Deposition of $SiO_2$ Using Catalyzed and Uncatalyzed Self–Limiting Surface Reactions*, 6 Surface Review and Letters, Nos. 3 and 4, pp. 435–448 (1999).

Chen et al., *Excimer Laser–Induced Ti Silicidation to Eliminate the Fine–Line Effect for Integrated Circuit Device Fabrication*, J. Electrochem, Soc., vol. 149, No. 11, pp. G609–G612 (2002).

Nishiyama et al., *Agglomeration Resistant Self–Aligned Silicide Process Using $N_2$ Implantation INto $TiSi_2$*, JPN. J. APPL. PHYS., vol. 36, Pt. 1, No. 6A, pp. 3639–3643 (Jun. 1997).

Wolf, *Chapter 13: Polycides and Salicydes of TiSix, CoSi2, and NiSi*, Silicon Processing For the VLSI Era, vol. IV, pp. 603–604 (pre–2003).

* cited by examiner

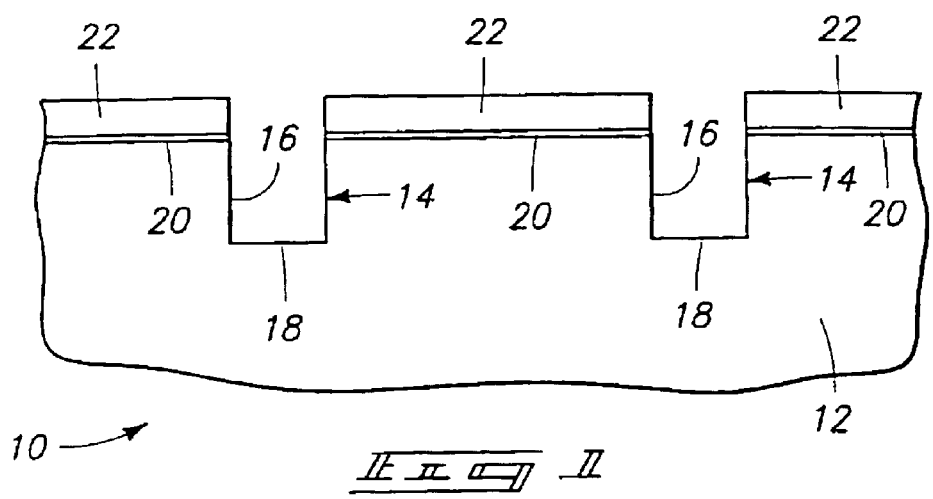
_FIG. 1_
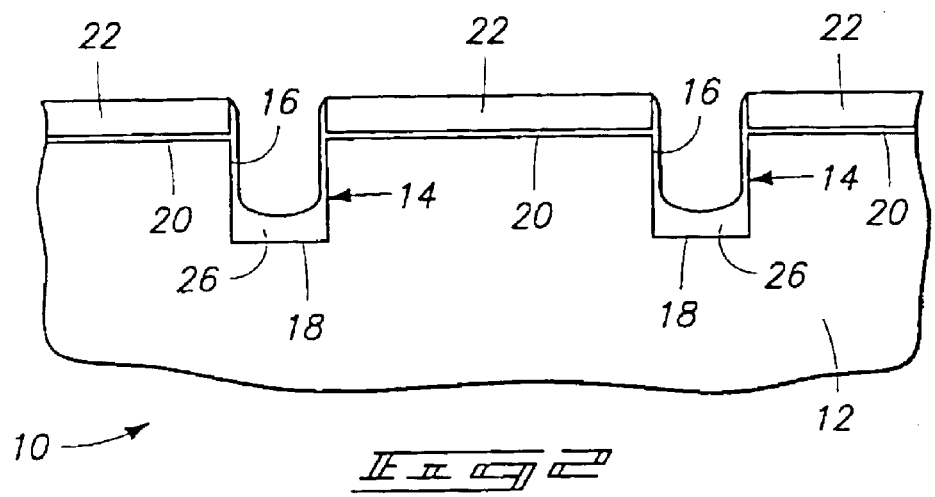
_FIG. 2_
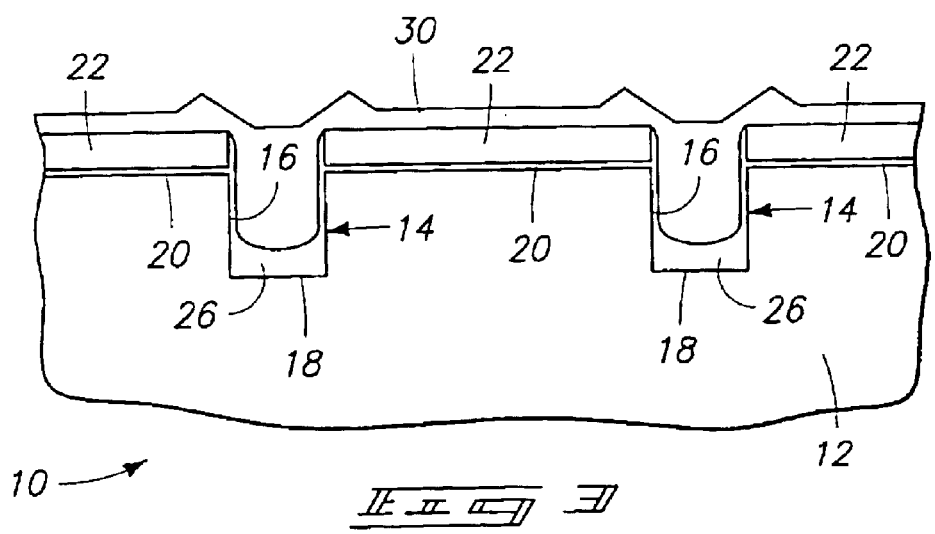
_FIG. 3_

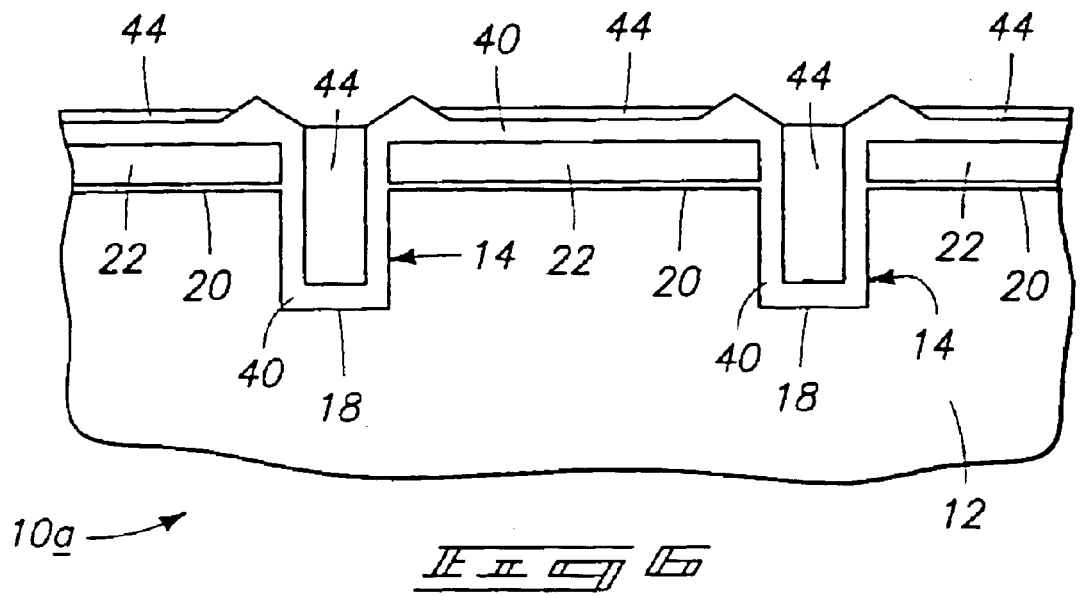
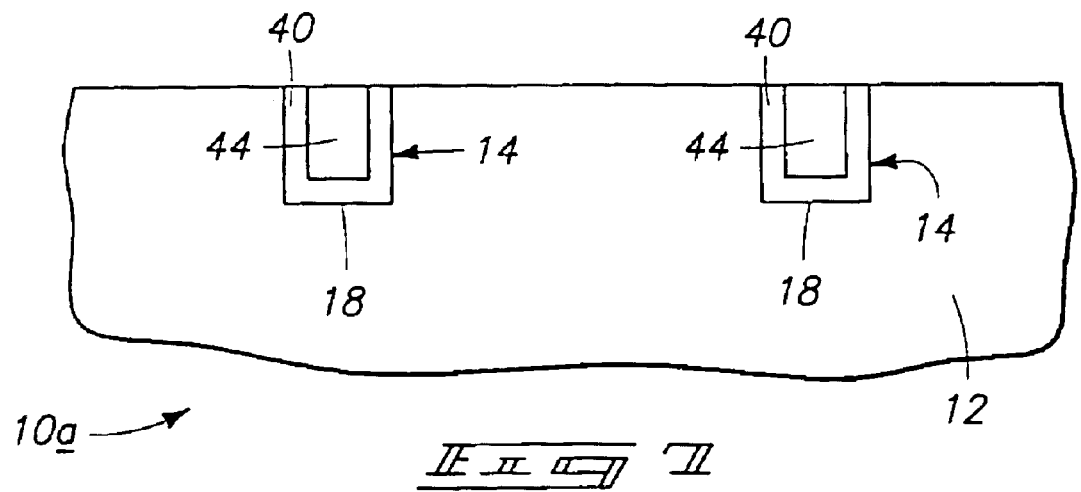

METHODS OF FORMING TRENCH ISOLATION REGIONS

RELATED PATENT DATA

This patent resulted from a divisional application of U.S. patent application Ser. No. 10/330,881, filed Dec. 23, 2002 entitled "Method of Forming Trench Isolation Regions", naming Trung Tri Doan and Gurtej S. Sandhu as inventors, the disclosure of which is incorporated by reference; which was a continuation application of U.S. patent application Ser. No. 10/209,865, filed Aug. 2, 2002, entitled "Method of Forming Trench Isolation Regions", naming Trung Tri Doan and Gurtej S. Sandhu as inventors, now U.S. Pat. No. 6,583,028, the disclosure of which is incorporated by reference; which was a continuation application of U.S. patent application Ser. No. 09/900,117, filed Jul. 6, 2001 now abandoned, entitled "Method of Forming Trench Isolation Regions", naming Trung Tri Doan and Gurtej S. Sandhu as inventors, the disclosure of which is incorporated by reference; which was a continuation of U.S. patent application Ser. No. 09/385.915, filed on Aug. 30, 1999, entitled "Method of Forming Trench Isolation Regions", naming Trung Tri Doan and Gurtej S. Sandhu as inventors, now U.S. Pat. No. 6,300,219 B1, the disclosure of which is incorporated by reference.

TECHNICAL FIELD

This invention relates to methods of forming trench isolation regions in semiconductive substrates.

BACKGROUND OF THE INVENTION

In modern semiconductor device applications, numerous devices are packed onto a single small area of a semiconductor substrate to create an integrated circuit. For the circuit to function, many of these individual devices may need to be electrically isolated from one another. Accordingly, electrical isolation is an important and integral part of semiconductor device design for preventing the unwanted electrical coupling between adjacent components and devices.

As the size of integrated circuits is reduced, the devices that make up the circuits must be positioned closer together in order to comply with the limited space available on a typical semiconductor substrate. As the industry strives towards a greater density of active components per unit area of semiconductor substrate, effective isolation between circuits becomes all the more important.

The conventional method of isolating circuit components in modern integrated circuit technology takes the form of trench isolation regions etched into a semiconductor substrate. Trench isolation regions are commonly divided into three categories: shallow trenches (STI) (trenches less than about 1 micron deep); moderate depth trenches (trenches of from about 1 to about 3 microns deep); and deep trenches (trenches greater than about 3 microns deep). Once the trench isolation regions are etched in the semiconductor substrate, a dielectric material is deposited to fill the trenches. As the density of components on the semiconductor substrate increased, the widths of the trenches decreased until the process of flowing dielectric material into the trenches developed problems.

Trench isolation regions, particularly STI regions, can develop undesirable voids in the dielectric material during the process to fill the trenches. As the dielectric material flows to an edge between a substrate surface and a sidewall of the trench, constrictions develop at the top of trenches due to the narrow opening in the trench. As the dielectric material flows into the trench, the constrictions can develop into voids moving into the trench with the dielectric material. Voids lower the dielectric characteristics of the dielectric material used and introduce structural instabilities in subsequent processes. Accordingly, voids in the dielectric material filling an isolation trench region are highly undesirable.

SUMMARY OF THE INVENTION

In accordance with an aspect of the invention, a method of forming a trench isolation region includes forming a trench within a substrate. A silanol layer is formed to partially fill the trench and then at least some of the silanol is converted to a compound comprising at least one of $SiO_n$ and $RSiO_n$, where R comprises an organic group. An electrically insulative material is formed over the converted silanol to fill the trench.

In another aspect of the invention, a method of forming a trench isolation region includes forming a trench within a substrate. A first layer of at least one of $Si(OH)_x$ and $(CH_3)_y Si(OH)_{4-y}$ is formed to partially fill the trench. At least some of the $Si(OH)_x$ if present is converted to $SiO_2$ and at least some of $(CH_3)_y Si(OH)_{4-y}$ if present is converted to $(CH_3)_x SiO_{2-x}$. Next, a layer of an electrically insulative material is formed to fill the trench.

In yet another aspect of the invention, a method of forming a trench isolation region includes forming a trench within a substrate. The trench has sidewalls comprising silicon and a base comprising silicon. A first electrically insulative layer is formed over the sidewalls and base. The first electrically insulative layer is anisotropically etched to expose silicon of the base while leaving silicon of the sidewalls covered. A second electrically insulative layer is substantially selectively chemical vapor deposited over the exposed trench base. A third electrically insulative layer is formed over the first and second insulative layers to within the trench.

In still another aspect of the invention, a method of forming a trench isolation region includes forming a trench having sidewalls within a substrate. The sidewalls are thermally oxidized in an oxidizing environment which includes oxygen and hydrogen with a greater molar concentration of hydrogen than oxygen. A layer of silanol is formed to within the trench and at least some of the silanol is converted to a compound of at least one of $SiO_n$ and $RSiO_n$, where R includes an organic group.

BRIEF DESCRIPTION OF THE DRAWINGS

Preferred embodiments of the invention are described below with reference to the following accompanying drawings.

FIG. 1 is a fragmentary sectional view of a semiconductor substrate at one processing step in accordance with a first embodiment of the invention.

FIG. 2 is a view of the FIG. 1 substrate fragment at a processing step subsequent to that shown in FIG. 1.

FIG. 3 is a view of the FIG. 1 substrate fragment at a processing step subsequent to that shown in FIG. 2.

FIG. 6 is a view of the FIG. 5 substrate fragment at a processing step subsequent to that of FIG. 5.

FIG. 7 is a view of the FIG. 5 substrate fragment at a processing step subsequent to that of FIG. 6.

DETAILED DESCRIPTION OF THE PREFERRED EMBODIMENTS

Figure 4:
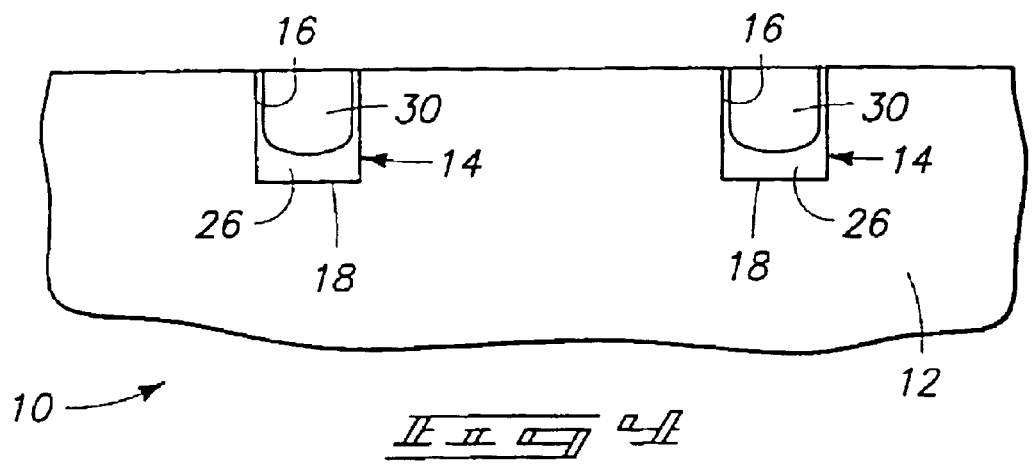
FIG. 4 is a view of the FIG. 1 substrate fragment at a processing step subsequent to that shown in FIG. 3.

This disclosure of the invention is submitted in furtherance of the constitutional purposes of the U.S. Patent Laws "to promote the progress of science and useful arts" (Article 1, Section 8).

With reference to FIGS. 1–4, a method of forming a trench isolation region is illustrated. Referring to FIG. 1, a semiconductor substrate fragment in process is indicated generally with reference numeral 10. Preferably, the semiconductor substrate fragment 10 comprises the following layers shown in elevationally ascending order: a semiconductor substrate 12, preferably a bulk monocrystalline silicon substrate; an oxide layer 20; and a silicon nitrite layer 22. A series of trenches 14 are formed, preferably by an etching process, through layers 20 and 22 and within semiconductor substrate 12. Trench isolation regions 14 have sidewalls 16 and base walls 18.

Referring to FIG. 2, a first layer 26 is formed, and initially comprises a silanol which partially fills trenches 14. An exemplary method of forming the first layer 26 is as follows. $SiH_4$ and $H_2O_2$ are separately introduced into a chemical vapor deposition (CVD) chamber, such as a parallel plate reaction chamber (not shown). The reaction rate between $SiH_4$ and $H_2O_2$ can be moderated by the introduction of nitrogen into the reaction chamber. Semiconductive substrate 12 within the chamber is preferably maintained at a suitably low temperature, such as 0° C., at an exemplary pressure of 1 Torr to achieve formation of a silanol-type material of the formula $Si(OH)_x$, which is predominately $Si(OH)_4$. The $Si(OH)_4$ condenses onto the semiconductor substrate 12 surface to form layer 26.

Alternatively, first layer 26 is formed to comprise $(CH_3)_y Si(OH)_{4-y}$ at least initially to partially fill the trench. The formation of $(CH_3)_y Si(OH)_{4-y}$ can be accomplished similarly to that described above for forming silanol, with the exception that $(CH_3)_z SiH_{4-z}$, wherein z is at least 1 and no greater than 4, is combined with the hydrogen peroxide $(H_2O_2)$. For example, $CH_3SiH_3$ can be combined with $H_2O_2$ to produce $CH_3Si(OH)_3$.

Although either reaction occurs in the gas phase, the initially deposited first layer 26 ($Si(OH)_x$ or $(CH_3)_y Si (OH)_{4-y}$) is preferably in the form of a viscous liquid which preferably flows very conformably, ideally depositing over trench base 18 faster and thicker than over sidewalls 16. A preferred thickness for first layer 26 is at least 25% of the trench depth, and more preferably at least 35%, while preferably adding only 200 angstroms or less to sidewalls 16.

After forming first layer 26 over semiconductor substrate 12, at least some of it is converted to a compound comprising at least one of $SiO_n$ and $RSiO_n$, where R comprises an organic group. An exemplary process for doing so is to treat first layer 26 with energy to drive water therefrom and convert to a silicon oxide comprising structure. A specific exemplary method of converting first layer 26 comprises exposing the first layer 26 to ultraviolet light, with other examples of energy being electron beam energy or plasma, and RF energy. Preferably, a two-step process is employed. First, polymerization of the liquid film is promoted by increasing the temperature to above 100° C., while maintaining the pressure of about 1 Torr, to result in solidification and formation of a polymer layer. Thereafter, the temperature is raised to above 300° C., preferably above 400° C., while maintaining a pressure of about 1 Torr, preferably at least 10 atmospheres.

Referring to FIG. 3, a second layer 30 is formed comprising an electrically insulative material, preferably silicon dioxide, over converted silanol layer 26 to within the trenches 14. Preferably as shown, second layer 30 is formed to fill remaining volume of trenches 14. An exemplary process for forming second layer 30 comprises chemical vapor deposition, preferably plasma-enhanced chemical vapor deposition. For example, conventional high density plasma deposited $SiO_2$ can be formed. In the context of this document, "high density" refers to a plasma having at least $10^{10}$ ions/cm$^3$ plasma density. An optional gettering process may be performed at this stage of the process.

Referring to FIG. 4, planarization can be conducted (i.e., chemical-mechanical polishing) to remove layers 30, 22 and 20 from over the substrate outside of trenches 14.

Figure 5:
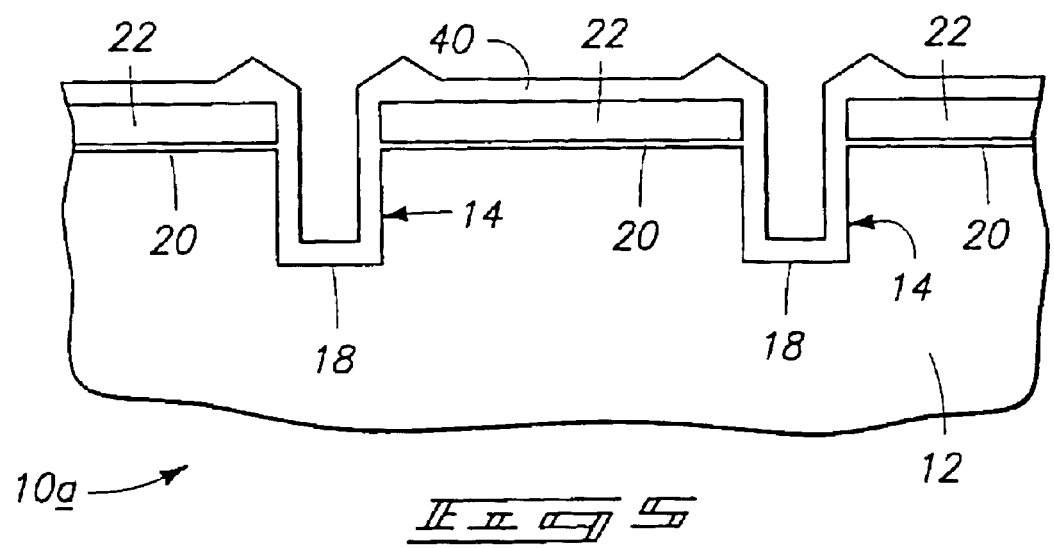
FIG. 5 is a fragmentary sectional view of a semiconductor substrate at one processing step in accordance with a second embodiment of the invention.

With reference to FIGS. 5–7, another embodiment in accordance with the invention is described. Like numerals from the first described embodiment are employed where appropriate, with differences being indicated with a suffix (a) or with different numerals. Referring to FIG. 5, a semiconductor substrate fragment in process is indicated generally with reference numeral 10a. An electrically insulating first layer 40 is chemical vapor deposited to within trenches 14 to partially fill the trenches. Preferably, first layer 40 comprises silicon dioxide $(SiO_2)$ and fills at least 25% of the trench 14 depth. First layer 40 is preferably deposited by plasma-enchanced chemical vapor deposition, preferably by high density plasma or subatmospheric chemical vapor deposition.

Referring to FIG. 6, a second layer 44 comprising a silanol is formed over first layer 40 to within trenches 14. Preferably, the method to form second layer 44 is by the same method previously discussed and disclosed for forming first layer 26 of the FIGS. 1–4 embodiment. Consequently, as with the previous method, second layer 44 preferably fills trenches 14, preferably is maintained at a temperature of at least about 300° C. and at a pressure of at least about 10 atmospheres effective to drive water from second layer 44, and preferably is converted to a silicon oxide comprising structure by exposure to energy, for example ultraviolet light.

Referring to FIG. 7, planarization can be conducted (i.e., chemical-mechanical polishing) to remove layers 44, 40, 22 and 20 from over the substrate outside of trenches 14.

With reference to FIGS. 8–12, yet another embodiment in accordance with the invention is described. Like numerals from the previously described embodiments are employed where appropriate, with differences being indicated with a suffix (b) or with different numerals.

Figure 8:
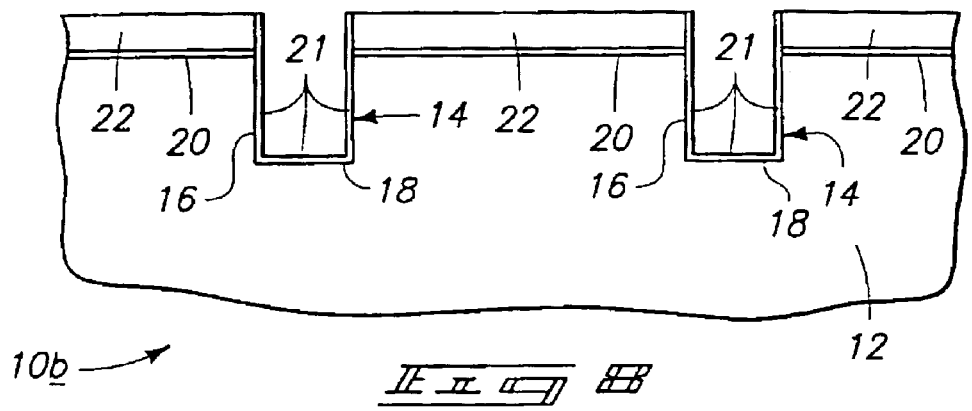
FIG. 8 is a fragmentary sectional view of a semiconductor substrate at one processing step in accordance with a third embodiment of the invention.

Referring to FIG. 8, a semiconductor substrate fragment in process is indicated generally with reference numeral 10b. An electrically insulative layer 21 is formed over silicon trench sidewalls 16 and trench base 18. An example thickness for layer 21 is 150 angstroms. A preferred material for layer 21 is silicon dioxide. An exemplary method of forming layer 21 comprises chemical vapor deposition, and alternatively thermal oxidation. An example thermal oxidation comprises flowing an oxidizing gas (i.e., $O_2$, $O_3$, $N_2O$, $NO_x$ or any mixture combination thereof) over substrate 12 within trenches 14 while substrate 12 is maintained at from 850° C. to 1150° C. for from 5 to 30 minutes. An example chemical vapor deposition process comprises injecting tetraethylorthosilicate (TEOS) into a reactor chamber at 500 mg/min while flowing $O_3$, preferably as a mixture of 12% $O_3$ and 88% $O_2$, at 4000 sccm and helium at from 014 200 sccm and maintaining the substrate 12 at 550° C. and reactor pressure at 200 Torr.

Figure 9:
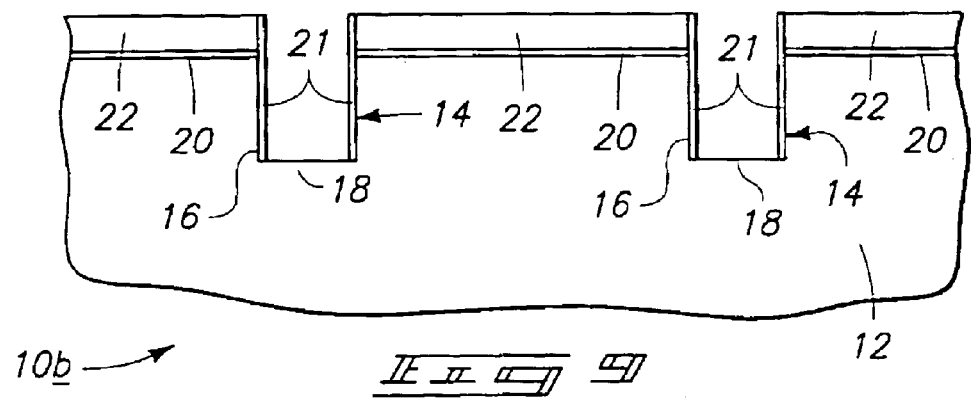
FIG. 9 is a view of the FIG. 8 substrate fragment at a processing step subsequent to that of FIG. 8.

Referring to FIG. 9, insulative layer 21 is anisotropically etched to expose silicon of the base walls 18 while leaving silicon of the sidewalls 16 covered. An exemplary anisotropic etch comprises a conventional oxide spacer etch.

Figure 10:
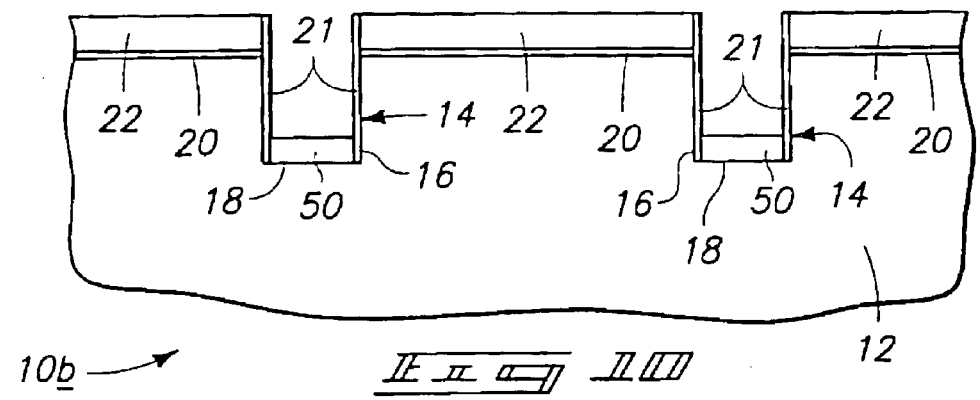
FIG. 10 is a view of the FIG. 8 substrate fragment at a processing step subsequent to that of FIG. 9.

Referring to FIG. 10, a second electrically insulative layer 50 is substantially selectively deposited over the exposed base walls 18 to partially fill the trenches 14. Preferably, layer 50 comprises an oxide deposited by chemical vapor deposition, and more preferably silicon dioxide. An exemplary chemical vapor deposition to form layer 50 comprises liquid injecting TEOS into a reactor chamber at 350 mg/min while flowing $O_3$, preferably as a mixture of 12% $O_3$ and 88% $O_2$, at 5000 sccm and helium at from 0–200 sccm and maintaining the substrate 12 at 400° C. and reactor pressure at 600 Torr.

Figure 11:
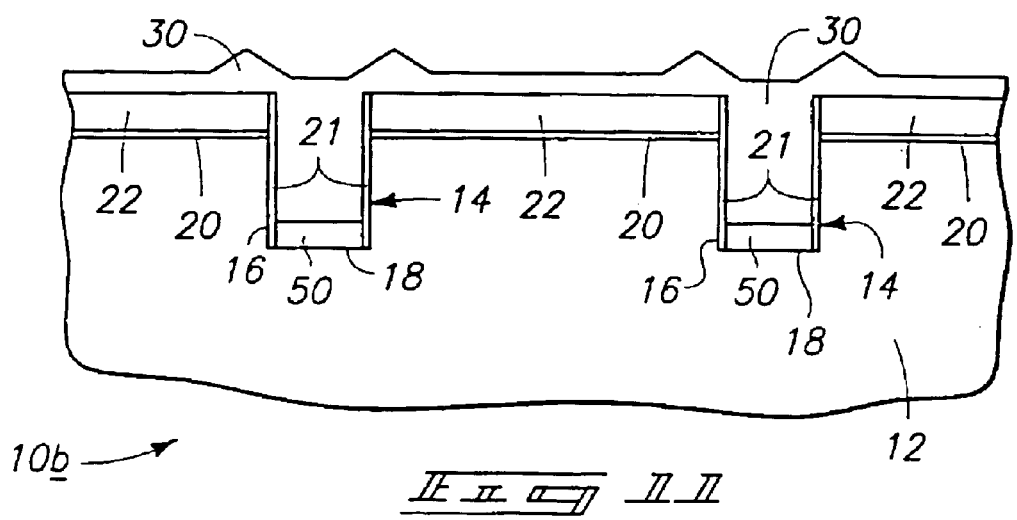
FIG. 11 is a view of the FIG. 8 substrate fragment at a processing step subsequent to that of FIG. 10.

Referring to FIG. 11, a layer 30 is formed comprising an electrically insulative material, preferably silicon dioxide, over layers 21, 22 and 50 to within trenches 14. Preferably as shown, layer 30 is formed to fill remaining volume of trenches 14. An exemplary process for forming second layer 30 comprises chemical vapor deposition, preferably high density plasma-enhanced chemical vapor deposition as described above. An alternative method of forming layer 30 comprises flowing a silanol layer to fill within trenches 14. The method to form layer 30 is preferably by the same method previously discussed and disclosed for forming first layer 26 of the first embodiment shown in FIGS. 1–4 and second layer 44 of the second embodiment shown in FIGS. 5–7.

Figure 12:
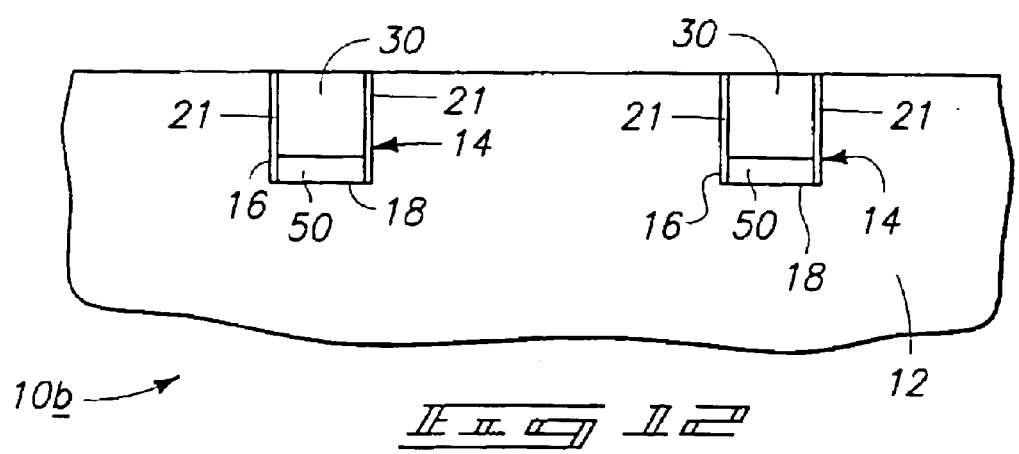
FIG. 12 is a view of the FIG. 8 substrate fragment at a processing step subsequent to that of FIG. 11.

Referring to FIG. 12, planarization can be conducted (i.e., chemical-mechanical polishing) to remove layers 30, 22, 21 and 20 from over substrate 12 outside of trenches 14.

Figure 13:
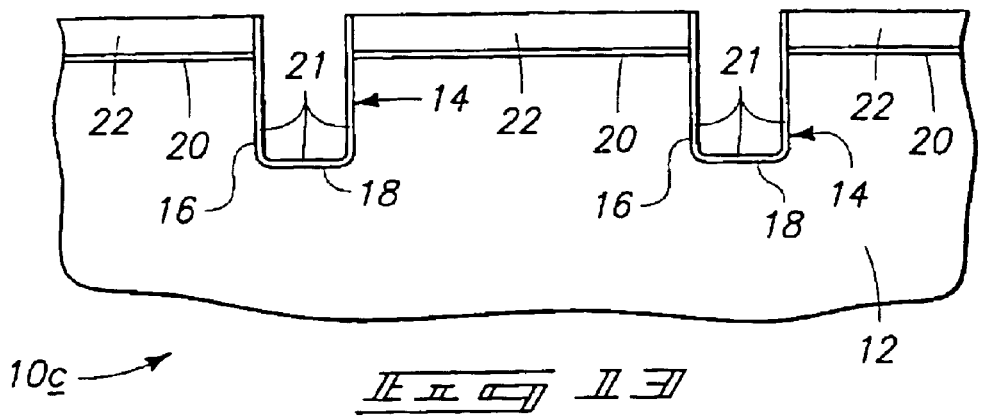
FIG. 13 is a fragmentary sectional view of a semiconductor substrate at one processing step in accordance with a fourth embodiment of the invention.
Figure 14:
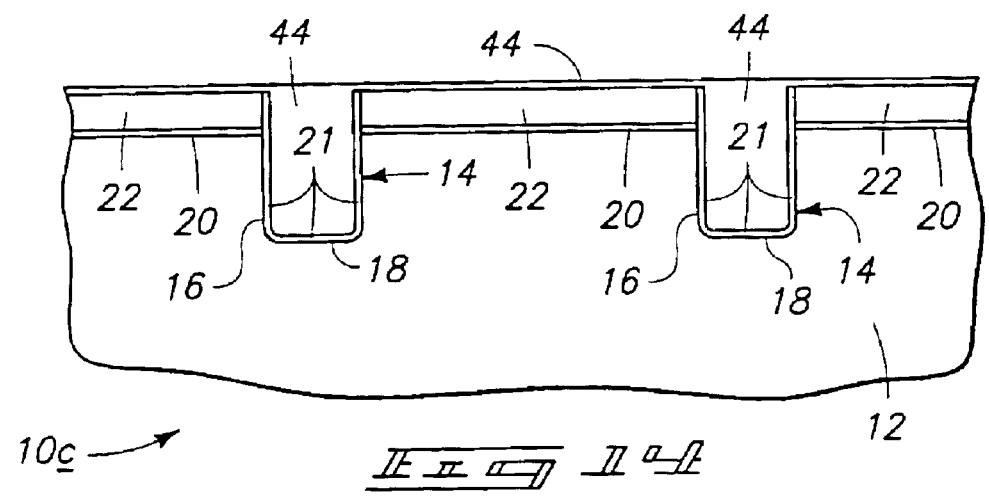
FIG. 14 is a view of the FIG. 13 substrate fragment at a processing step subsequent to that of FIG. 13.
Figure 15:
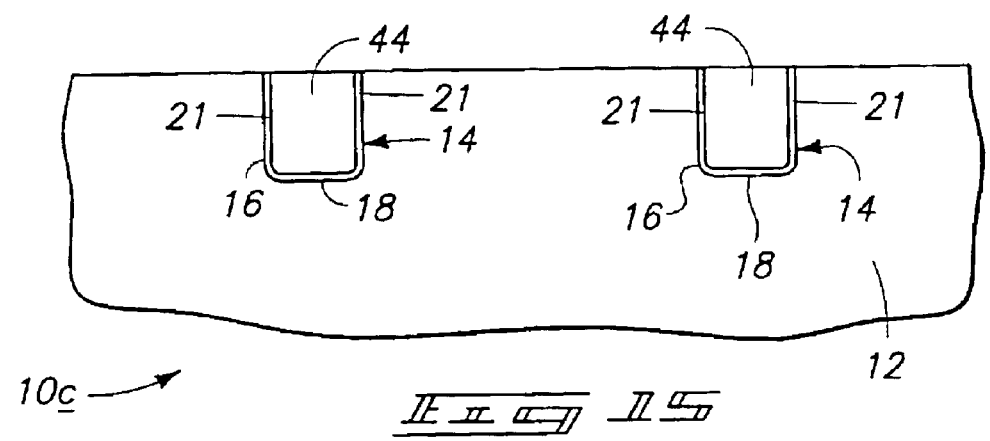
FIG. 15 is a view of the FIG. 13 substrate fragment at a processing step subsequent to that of FIG. 14.

With reference to FIGS. 13–15, still another embodiment in accordance with the invention is described. Like numerals from the first described embodiment are employed where appropriate, with differences being indicated with a suffix (c) or with different numerals. Referring to FIG. 13, an electrically insulative layer 21 is formed over silicon trench sidewalls 16 and trench base 18 by a thermal oxidation process. An exemplary method of forming layer 21 comprises thermally oxidizing the sidewalls of the trench in an oxidizing environment comprising oxygen and hydrogen and having a greater molar concentration of hydrogen than oxygen. An example thermal oxidation comprises flowing an oxidizing gas at 200 sccm (i.e., $O_2$, $O_3$, $N_2O$, $NO_x$ or any mixture combination thereof) and hydrogen source at 1 slm (i.e., $H_2$, $NH_3$ or any mixture combination thereof) over substrate 12 within trenches 14. Preferably, substrate 12 is maintained at from 800° C. to 1100° C. and reactor pressure at from 10 Torr to 760 Torr for from 1 to 20 minutes.

Referring to FIG. 14, a silanol layer 44 is formed over layers 21 and 22 to within trenches 14. At least some of the silanol is converted to a compound comprising at least one of $SiO_n$ and $RSiO_n$, where R comprises an organic group. The method to form layer 44 is preferably by the same method previously discussed and disclosed for forming first layer 26 of the first embodiment shown in FIGS. 1–4 and second layer 44 of the second embodiment shown in FIGS. 5–7.

Referring to FIG. 15, planarization can be conducted (i.e., chemical-mechanical polishing) to remove layers 44, 22, 21 and 20 from over substrate 12 outside of trenches 14.

Alternatively, the silanol 44 could be formed within trenches 14 and converted before a sidewall oxidation. Preferably in such instance, the thermal oxidation conditions comprise flowing an oxidizing gas at 200 sccm (i.e., $O_2$, $O_3$, $N_2O$, $NO_x$ or any mixture combination thereof) over substrate 12 within trenches 14 while substrate 12 is maintained at from 850° C. to 1150° C. and reactor pressure at from 10 Torr to 760 Torr for from 5 to 30 minutes.

Further in accordance with the invention, sidewalls 16 might be oxidized prior to forming first layer 26 in the first embodiment, or prior to forming first layer 40 in the second embodiment. Alternately, sidewalls 16 might be oxidized after forming first layer 26 and before forming second layer 30 in the first embodiment, or after forming first layer 40 and before forming second layer 44 in the second embodiment, or after forming layer 50 and before forming layer 30 in the third embodiment. Further alternately, sidewalls 16 might be oxidized after forming second layer 30 in the first embodiment, or after forming layer 44 in the second embodiment. Further alternately with respect to the third embodiment, and where layer 21 is not formed by thermal oxidation, the sidewalls might be oxidized after forming layer 50 and before forming layer 30, or after forming layer 50. Conventional thermal oxidations are preferably conducted in such instances.

In the preferred first embodiment, first layer 26 flows conformably into the trenches during deposition without forming any constrictions at the top of the trenches where voids begin. The first layer 26 effectively lowers the aspect ratio (defined as trench depth to width) of the trenches preferably by filling at least about a third of the depth whiles only adding at most 200 angstroms of layer on the sidewalls. As a result, any subsequent layer deposited to fill the layer will have a trench with a lower aspect ratio more conducive to filling without voids.

In the less preferred second and third embodiments, the first layer is formed by less preferred methods which may not lower the aspect ratio as significantly as in the first embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a trench isolation region comprising:

forming an isolation trench within semiconductive material of a semiconductive substrate; and filling the isolation trench with electrically insulative material, the filling comprising an initially liquid deposition within the isolation trench, the filling comprising a subsequent initially solid deposition within the isolation trench.

2. The method of claim 1 wherein the filling comprises forming an oxide layer over sidewalls of the trench prior to both of the initially liquid deposition and the subsequent initially solid deposition.

3. The method of claim 1 wherein the liquid comprises a silanol.

4. The method of claim 1 wherein the insulative material comprises silicon dioxide.

5. The method of claim 1 wherein the liquid deposition powers an aspect ratio of the trench from what is was prior to the liquid deposition.

* * * * *

UNITED STATES PATENT AND TRADEMARK OFFICE
CERTIFICATE OF CORRECTION

PATENT NO.         : 7,012,010 B2
APPLICATION NO. : 10/688439
DATED                  : March 14, 2006
INVENTOR(S)       : Trung Tri Doan et al.

It is certified that error appears in the above-identified patent and that said Letters Patent is hereby corrected as shown below:

Col. 5, line 21 –
    Replace "$O_3$ and 88% $O_2$, at 4000 sccm and helium at from 014 200"
    With -- $O_3$ and 88% $O_2$, at 4000 sccm and helium at from 0-200--

Col. 8, line 18, claim 5 –
    Replace "powers an aspect ratio of the trench from what is was prior"
    With --lowers an aspect ratio of the trench from what it was prior--

Col. 8, line, 12
Please insert the following claims:
  --6. The method of claim 1 comprising solidifying material of the initially liquid deposition prior to the subsequent initially solid deposition.

7. The method of claim 1 wherein the initially liquid deposition and the initially solid deposition occur at different temperatures.

8. The method of claim 7 wherein the initially liquid deposition is conducted at temperature lower than that of the initially solid deposition.

9. The method of claim 1 comprising annealing the material of the initially liquid deposition prior to the subsequent initially solid deposition.

10. The method of claim 9 wherein the annealing is effective to solidify the material of the initially liquid deposition prior to the subsequent initially solid deposition.

11. The method of claim 1 wherein the initially liquid deposition comprises introducing $SiH_4$ and $H_2O_2$ into a chamber within which the semiconductive substrate is received.

12. The method of claim 1 wherein the initially liquid deposition comprises introducing $SiH_4$, $H_2O_2$, and $N_2$ into a chamber within which the semiconductive substrate is received.

13. The method of claim 1 wherein the initially liquid deposition comprises introducing $(CH_3)_zSiH_{4-z}$ and $H_2O_2$ into a chamber within which the semiconductive substrate is received, where z is at least 1 and no greater than 4.

14. The method of claim 13 wherein the $(CH_3)_zSiH_{4-z}$ comprises $CH_3SiH_3$.

UNITED STATES PATENT AND TRADEMARK OFFICE
CERTIFICATE OF CORRECTION

| | | |
|---|---|---|
| PATENT NO. | : 7,012,010 B2 | Page 2 of 3 |
| APPLICATION NO. | : 10/688439 | |
| DATED | : March 14, 2006 | |
| INVENTOR(S) | : Trung Tri Doan et al. | |

It is certified that error appears in the above-identified patent and that said Letters Patent is hereby corrected as shown below:

Please insert the following claims (cont'd):

15. The method of claim 1 wherein material of the initially liquid deposition deposits over a base of the isolation trench faster than over sidewalls of the isolation trench.

16. The method of claim 1 wherein material of the initially liquid deposition deposits over a base of the isolation trench thicker than over sidewalls of the isolation trench.

17. The method of claim 1 comprising exposing material of the initially liquid deposition to ultraviolet light prior to the subsequent initially solid deposition.

18. The method of claim 17 comprising exposing material of the initially liquid deposition to a temperature greater than a temperature at which the initially liquid deposition initially occurred prior to said exposing to ultraviolet light.

19. The method of claim 1 comprising exposing material of the initially liquid to an electron beam prior to the subsequent initially solid deposition.

20. The method of claim 19 comprising exposing material of the initially liquid deposition to a temperature greater than a temperature at which the initially liquid deposition initially occurred prior to said exposing to the electron beam.

21. The method of claim 1 comprising exposing material of the initially liquid to a plasma prior to the subsequent initially solid deposition.

22. The method of claim 21 comprising exposing material of the initially liquid deposition to a temperature greater than a temperature at which the initially liquid deposition initially occurred prior to said exposing to plasma.

23. The method of claim 1 comprising exposing material of the initially liquid deposition to RF energy prior to the subsequent initially solid deposition.

UNITED STATES PATENT AND TRADEMARK OFFICE
CERTIFICATE OF CORRECTION

| | | |
|---|---|---|
| PATENT NO. | : 7,012,010 B2 | Page 3 of 3 |
| APPLICATION NO. | : 10/688439 | |
| DATED | : March 14, 2006 | |
| INVENTOR(S) | : Trung Tri Doan et al. | |

It is certified that error appears in the above-identified patent and that said Letters Patent is hereby corrected as shown below:

Please insert the following claims (cont'd):
    24. The method of claim 23 comprising exposing material of the initially liquid deposition to a temperature greater than a temperature at which the initially liquid deposition initially occurred prior to said exposing to RF energy.--

Signed and Sealed this

Seventeenth Day of July, 2007

JON W. DUDAS
*Director of the United States Patent and Trademark Office*